(12) United States Patent
Bardash

(10) Patent No.: US 8,350,225 B1
(45) Date of Patent: Jan. 8, 2013

(54) SOLID STATE TISSUE EQUIVALENT DETECTOR, MAIN COMPONENT FOR A LIGHT-WEIGHT TISSUE EQUIVALENT MICRODOSIMETER

(76) Inventor: Michael Bardash, Brooklyn, NY (US)

( * ) Notice: Subject to any disclaimer, the term of this patent is extended or adjusted under 35 U.S.C. 154(b) by 126 days.

(21) Appl. No.: 13/015,049

(22) Filed: Jan. 27, 2011

Related U.S. Application Data

(60) Provisional application No. 61/298,683, filed on Jan. 27, 2010.

(51) Int. Cl.
| | |
|---|---|
| H01L 27/14 | (2006.01) |
| H01L 27/144 | (2006.01) |
| H01L 31/0352 | (2006.01) |
| H01L 51/42 | (2006.01) |
| H01L 51/44 | (2006.01) |

(52) U.S. Cl. ............... 250/370.07; 250/370.14; 257/40; 257/E51.013

(58) Field of Classification Search .............. 250/370.07, 250/370.14; 257/40, E51.013
See application file for complete search history.

(56) References Cited

U.S. PATENT DOCUMENTS

| | | | |
|---|---|---|---|
| 7,977,643 B2 * | 7/2011 | Weinberg | 250/370.01 |
| 8,212,141 B2 * | 7/2012 | Miyata et al. | 136/251 |

* cited by examiner

*Primary Examiner* — Evan Pert
(74) *Attorney, Agent, or Firm* — Gottlieb, Rackman & Reisman, PC

(57) ABSTRACT

An organic semiconductor device for detecting and measuring radiation has a total active area of less than 100 square microns ($\Box m^2$) and comprises at least two bulk organic semiconductor regions with each region connected on one side to an independent biasing voltage electrode and connected on an opposing side to a common output electrode.

6 Claims, 2 Drawing Sheets

Biasing Scheme for the SSTED

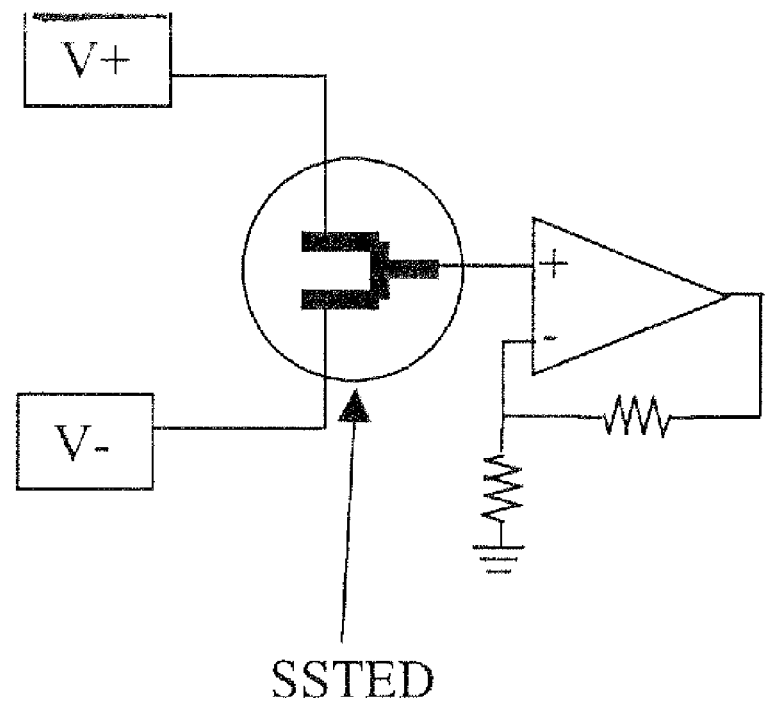
Fig. 2 Biasing Scheme for the SSTED

SOLID STATE TISSUE EQUIVALENT DETECTOR, MAIN COMPONENT FOR A LIGHT-WEIGHT TISSUE EQUIVALENT MICRODOSIMETER

This application claims priority of provisional application 61/298,683 filed Jan. 27, 2010.

FIELD OF THE INVENTION

This invention concerns a novel type of tissue equivalent detector that combines semiconductor device construction principles and organic photo-conductor technology.

BACKGROUND OF THE INVENTION

Current tissue equivalent detectors are primarily proportional counters. These devices are ion chamber like devices that are filled with a tissue equivalent gas, where the charge collection is "amplified" by a strong electric field that is produced in a high voltage region of the detector. The dimensions of its active region are orders of magnitude larger than those of typical cellular dimensions. In order for these devices to function as microdosimeters it is necessary to have an appropriate product of the density of the active region and the characteristic dimension (diameter for spherical detectors). Gas-filled proportional counter type detectors therefore are filled with a low-pressure combination of gases that have the correct proportion of tissue equivalent elements (primarily carbon, hydrogen, and oxygen).

There are a number of known problems associated with these proportional counters. Most notable are:

Typically, they require the presence of a vacuum system aintain the appropriate gas mixture. While sealed devices can be constructed, they are generally subject to leakage over time. Since the devices are large, and the charge multiplication and collection is happening in a low-pressure gas, they require high voltage for efficient operation.

Since the overall size of these devices is orders of magnitude larger than living cells, they will collect events over a significant macroscopic volume. Their response to individual particles would be microdosimetrically correct. However the possibility exists that two or more particles may be incident on the active region at "the same time" even if those incident particles are separated by distances on the order of millimeters (or perhaps more). The response of the gas filled detector to this class of events will be microdosimetrically incorrect.

To overcome these drawbacks, it was disclosed in my prior patent, U.S. Pat. No. 6,278,117, to employ a solid state photoconducting detector that senses ionizing radiation and which is primarily made out of organic material that has a density very close to that of normal tissue. Microstructures were used to make a semiconductor out of a polymer and to measure the current through the polymer without relying on long range conduction. The invention of U.S. Pat. No. 6,278,117 arranged the microstructures in a particular geometry that reduced the capacitance and the noise associated with large capacitance. In particular it placed the polymer on the top of a double layer which reduces the capacitance of the system. The detector's efficiency for any given radiation quality and energy could be measured. Once this was done, the detector was able to directly measure dose equivalence.

In particular, the invention disclosed in U.S. Pat. No. 6,278,117, provided a tissue equivalent solid state detector comprising a polymeric substrate having on its surface, by deposition or other means, a metallic hinder layer. A metallic electrode layer contacted the metallic binder layer. An active polymeric layer was cast onto the polymeric substrate, so that the metallic electrode layer was embedded in the active polymeric layer. The metallic electrode layer had at least two interdigitated conductor lines, each leading to a wire such that there was a small capacitance between the pair of wires. In operation a source of potential was place across the wires and the resistance and/or current across the conductors was measured with an electrometer, bridge or electronic monitoring circuit.

The invention disclosed in U.S. Pat. No. 6,278,117 further comprised a method for manufacturing such a detector. The method uses photolithographic techniques on a polymer surface by the steps of printing interdigitated metal patterns on the substrate by a liftoff process, sputtering a hinder layer and a metal electrode layer onto the substrate, peeling or lifting off the metal layers to leave the interdigitated patterns of polymer substrate, dicing the substrate so that each interdigitated pattern set becomes one die detector, bonding a die detector into a tissue equivalent case, bonding wires to permit connecting the die's bonding pads to external connections, and applying a polymer as the active region of the device. The polymer used was selected from among polythiophene, polyanaline, polyphenylene, and polyphenylene vinylene polymers.

BRIEF DESCRIPTION OF THE INVENTION

The detector is an improvement on the invention disclosed in U.S. Pat. No. 6,278,117 issued to the same inventor. It is a solid state device that has an active region with a characteristic dimension on the order of 1 μm; is comprised of organic material (electrical contacts aside); is small and lightweight; will operate at a relatively low voltage; and, will have a tissue equivalent response based on its constituent components. The characteristic dimension of the SSTED is that of a typical cell. Therefore, the detector will not detect multiple particle events that would not have happened within a single cell.

The device will be referred to as the SSTED (Solid State Tissue Equivalent Detector). It has first stage pre-amplification that will allow its output to easily be processed and turned into meaningful microdosimetric data.

BRIEF DESCRIPTION OF THE DRAWINGS

FIG. 2 depicts a Biasing Scheme for an SSTED Device.

DETAILED DESCRIPTION OF PREFERRED EMBODIMENTS

Figure 1:
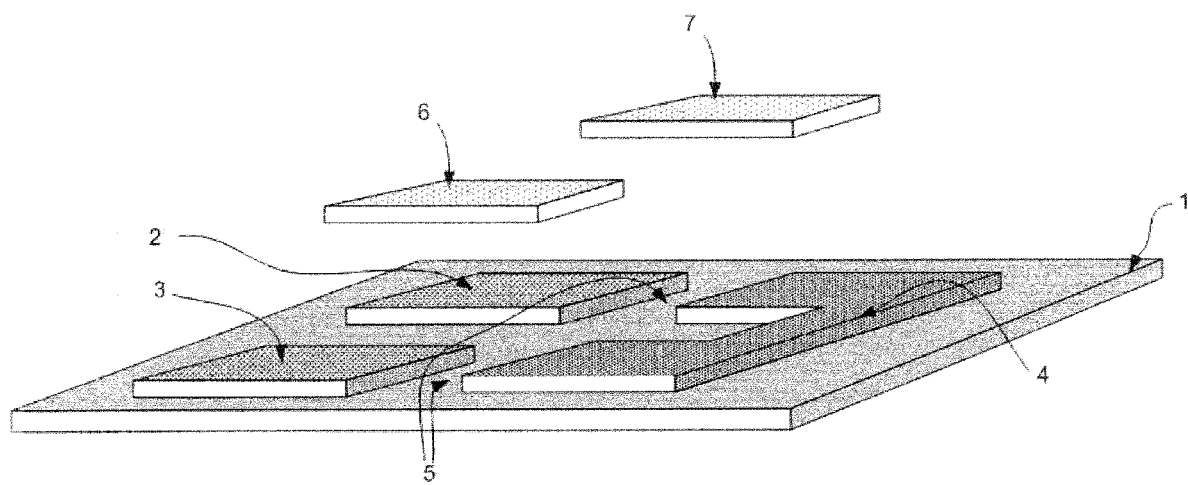
FIG. 1 shows the device layout for the SSTED 1. As shown in the figure, V+ is connected to the positive lead 2. A 2 μm gap 5 is left between the positive lead and the common-out-lead 4. The active region 6 is deposited over that gap. Similarly, V− is attached to the negative lead 3, a 2 μm gap is left between the negative lead and the common-out-lead 4, and a second active region is deposited over this second gap.

FIG. 1 shows the device layout for the SSTED. As shown in the figure, V+ is connected to the positive lead. A 2 μm gap is left between the positive lead and the common-out-lead. The active region is deposited over that gap. Similarly, V− is attached to the negative lead, a 2 μm gap is left between the negative lead and the common-out-lead, and a second active region is deposited over this second gap.

In theory, the geometry ensures that the resistance in each active region is the same. In that case, when V+ is 10 volts and V− is −10 volts the symmetry assures that the common-out-lead will be held at 0 volts. If subsequently the active region adjacent to V+ is irradiated, carriers will be generated within that region, and the resistance will drop. The voltage at the common-out-Lead will rise as long as the carriers remain uncollected/unrecombined within the active region due to the change in resistivity.

The active regions are comprised of undoped pentacene, an intrinsic semiconductor whose dominant carriers are holes. The band gap for this material is 1.82 eV and the hole mobility $\mu_h$ can be larger than 1 cm²/Vs if the material is deposited using a well understood but somewhat arduous deposition process. These properties, along with the effective mass can be used to calculate the resistivity of pentacene, but it is more useful to use experimental results. A number of papers have reported this resistivity ($\rho$) as $10^8$ $\Omega$cm.

When a voltage is applied across opposite faces of a box of material with resistivity $\rho$, a current will flow in a direction that is normal to those faces. The resistance R of that box is given by the standard equation:

$$R = \rho d/A \quad \quad 1)$$

where A is the area of either of the faces where the voltage is being applied and d is the separation between the faces. For the most part, the active region of the SSTED is a 2 μm cube with a voltage being applied across two opposing faces. While the active region layer and the leads don't truly form a cube, the electric field across the gap region is very strong and quite uniform. There will be some field bending effects around the edges, but the region where the field is very strong will dominate so that the overall shape of the region where carriers will be affected by the electric field will be a cube. Plugging in $2\times 10^{-4}$ cm for d, $(2\times 10^{-4}$ cm$)^2$ for A, and the reported resistivity for pentacene shows that the expected resistance R of the active region will be between $10^{11}$ and $10^{12} \Omega$.

There will be some dark current flowing in the active region as a result of the intrinsic carrier concentration. If the voltage across the active region is 10 volts and the resistance is $5\times 10^{11}$ the resulting dark current will be $2\times 10^{-11}$ amps. The total number of intrinsic holes $N_h$ within the active region can then be calculated using the relationships:

$$J = pq\mu_h E \quad \quad 2)$$

$$N_h = pV \quad \quad 3)$$

where J is the current density, p the hole carrier concentration, q the charge, $\mu_4$ the hole mobility, E the applied electric field, and $N_h$ the total number of carriers in volume V. Based on the description of the device the relevant quantities to solve for $N_h$ are:

$$J = 10^{-11} \text{ amps}/(2\times 10^{-4} \text{ cm})^3$$

$$V = (2\times 10^{-4} \text{ cm})^3$$

$$q = 1.6\times 10^{-19} \text{ coulombs}$$

$$\mu_h = 1 \text{ cm}^2/\text{Vs}$$

$$E = 10 \text{ V}/2\times 10^{-4} \text{ cm}$$

The resulting value for the total number of holes within the active region $N_h$ is found to be $1.25\times 10^3$ or, an order of magnitude calculation shows that the expected number of intrinsic carriers within the active region will be $10^3$.

The design calls for dual active regions as described above. The main reason for this is that the resistance of the devices is quite high and fairly difficult to measure. This makes it difficult to design biasing circuits using standard electronic components. The dual active region configuration allows each active region to act as one arm of a voltage divider so that the common-out-lead is held in balance. The common-out-lead is connected to an extremely high input impedance instrument/operational amplifier. These op-amps may have input impedances at least 2 orders of magnitude higher than that of the active region, so that the amplifier does not significantly affect the measurement.

FIG. 2 shows a representative biasing circuit diagram for the SSTED.

The entire circuit (the detector the wiring and the op-amp) may be surface mounted with a guarded conducting plane surrounding all of the electrical connections so that spurious current will not affect the measurements. The output stage of the operational amplifier is low impedance, so that subsequent amplification, signal detection, and processing are straightforward. For initial biasing, the voltage V− will be a variable voltage source so that the output from the op amp can be driven down close to 0 volts.

It should be noted that the dual active region design allows for the possibility that both active regions are irradiated simultaneously. At relatively low dose levels the probability of this happening is very small, but not zero. If this is not tolerable, then one of the active regions tray need to be shielded.

The overall noise of the circuit will depend on the quality of the amplifier and the stability and dark current of the SSTED. For the amplifiers being considered the noise is measured in femptoamps. The dark current is significantly larger than the noise figure of the amplifier, so the dark current and its associated noise are the limiting factor for determining the sensitivity.

When a particle with a Linear Energy Transfer (LET) of 200 eV/μm is incident on a 2 μm active region it will deposit energy of 400 eV. That translates into about 220 electron-hole pairs based on the band gap energy. Since holes are by far the most mobile carrier, they are the largest contributor to any measured signal. Therefore, in the worst case, the particle will produce about 200 carriers. The dark current arises from the existence of the intrinsic carriers and there are about 1000 such carriers within the active region at any time. In theory, this means that there will be significant effect (20% change in resistivity) in response to the incident particle. For most detection schemes reported to date, the minimum number of electron-hole pairs that the amplifier can accommodate is 1000. It appears that this detection scheme could be more sensitive, but it may suffer from other practical limitations. Whether or not the scheme will allow the detection of these lower LET particles will therefore be determined by the other noise sources associated with the detector design. These numbers would suggest that the detector response will be on the order of 1 volt. Considering that these numbers are all estimates, a conservative expectation for the response to this type of irradiation in a practical device would be on the order of 10-100 millivolts.

The noise most commonly associated with these types of radiation detectors is capacitance noise. Most radiation detectors have fairly large capacitance, since the physical volume of the device must be large enough to capture charges. At the same time, there must be a high enough voltage within that same volume to collect the charges. The SSTED does not suffer the same order of magnitude capacitance problem. To first order the SSTED is a parallel plate capacitor with capacitance given by:

$$C = \in A/d \quad \quad 4)$$

where C is capacitance, $\in$ is the material's dielectric constant, A is the area of the "plate" and d is the separation. A and d are the same dimensions as those used to calculate the resistance of the active region above, and the dielectric constant is approximately 2.7 times that of free space. The overall capacitance of the device is at least 100 times lower than 1 pF. The noise figure measured in total charge as a result of this capacitance is well under 10 charges, so that the dark current noise and/or signal will dominate the capacitance noise.

The SSTED is therefore primarily a resistive device and the Johnson-Nyquist noise still must be considered. The root mean square (rms) of the voltage is given as:

$$V_{rms}=(4k_b TR\Delta f)^{1/2} \quad \quad 5)$$

where T is temperature, $k_b$ is Boltzmann's constant, R is the resistance of the devices and $\Delta f$ is the bandwidth over which the noise should be measured. Using an R on the order of $10^{12} \Omega$, and a bandwidth of $10^4$ Hz, the expected $V_{rms}$ will be on the order of 10 millivolts. This is not an insignificant noise value, but, as stated above, the expected minimum signal will be on the order of 10 millivolts. This would give a worst case signal to noise ration (SNR) of 1.

Features of the proposed SSTED device are:
 1. Expected device resistance of $10^{11}$ to $10^{12} \Omega$
 2. Expected dark current of $2 \times 10^{-11}$ amps arising from order of magnitude $10^3$ intrinsic carriers
 3. Negligible device capacitance and/or capacitance noise
 4. An expected SNR of at least 1 (for the lowest LET particles)

Unlike the proportional counters, the SSTED is a solid-state device, and the active region has a nominal density very close to 1 (same as water). The characteristic dimension of the active region is between 1 and 5 μm depending on specific device design parameters.

The benefits of the device include:
 1. Since the device is solid state its composition remains stable over time.
 2. The active region is made from an organic semi-conductor with a nominal band gap of 1.82 eV. The band gap determines the number of carriers that will be created in response to an event, and hence serves the same purpose as the W-value does in cavity theory. The band gap here is significantly lower than the standard W-value so that the number of charges created per event is significantly higher. Overall, this means that the detector is more sensitive before proportional amplification. Charge amplification is not required.
 3. The spacing between the electrodes within the active region is of order 1 μm. This means that field produced with a 10-volt bias is on the order of $10^7$ V/m. Thus, the detector can operate at a reasonably low voltage and still have high collection efficiency.

The characteristic dimension of the SSTED is that of a typical cell. Therefore, the detector will not detect multiple particle events that would not have happened within a single cell.

For low dose rate applications, two dimensional arrays of SSTEDs can be fabricated and individually biased so that overall effective cross-section of the array would be considerably larger than that of a single device. Each element would still have the correct microdosimetric response, and the array would be more likely to capture individual events.

The invention claimed is:

1. An organic semiconductor device for detecting radiation having a total active area of less than 100 square microns comprising at least two bulk organic semiconductor regions with each region connected on one side to an independent biasing voltage electrode and connected on an opposing side to a common output electrode.

2. The organic semiconductor device for detecting radiation of claim 1 comprising three wire electrodes one of which is a common output electrode and two semiconductor regions, such that an output voltage of the common output electrode is held at 0 volts when the device is not being irradiated.

3. The organic semiconductor device for detecting radiation of claim 2 comprising pentacene as an active region deposited on a polyimide substrate, gold electrodes and having each of two active regions configured as a square with an area of between 1 and 5 square microns.

4. The organic semiconductor device for detecting radiation of claim 2 for measuring ionizing radiation in the form of photons whereby an output representing the difference in the response between the two semiconductor regions is proportional to the energy of the photons deposited within the organic semiconductor regions.

5. The organic semiconductor device for detecting radiation of claim 2 wherein the radiation comprises individual heavier particles selected from the group consisting of protons, particles, and other higher linear energy transfer particles (LET).

6. The organic semiconductor device for detecting radiation of claim 2 wherein the organic semiconductor material is appropriate to measure both dose and dose equivalents

* * * * *